United States Patent
Kawakami et al.

(10) Patent No.: US 9,614,224 B2
(45) Date of Patent: Apr. 4, 2017

(54) CATHODE ACTIVE MATERIAL FOR LITHIUM BATTERY, LITHIUM BATTERY, AND METHOD FOR PRODUCING CATHODE ACTIVE MATERIAL FOR LITHIUM BATTERY

(71) Applicant: TOYOTA JIDOSHA KABUSHIKI KAISHA, Toyota-shi, Aichi-ken (JP)

(72) Inventors: Masatsugu Kawakami, Gotenba (JP); Takamasa Ohtomo, Susono (JP); Yuki Kato, Gotenba (JP); Hisatsugu Yamasaki, Gotenba (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/817,956

(22) Filed: Aug. 4, 2015

(65) Prior Publication Data
US 2016/0043395 A1    Feb. 11, 2016

(30) Foreign Application Priority Data
Aug. 8, 2014 (JP) ................ 2014-162251

(51) Int. Cl.
*H01M 4/505* (2010.01)
*H01M 4/36* (2006.01)
(Continued)

(52) U.S. Cl.
CPC .......... *H01M 4/505* (2013.01); *C23C 14/34* (2013.01); *H01M 4/131* (2013.01); *H01M 4/366* (2013.01);
(Continued)

(58) Field of Classification Search
CPC .... H01M 4/505; H01M 4/366; H01M 4/5825; H01M 4/62; H01M 4/131;
(Continued)

(56) References Cited

U.S. PATENT DOCUMENTS

| | | |
|---|---|---|
| 2009/0081554 A1 | 3/2009 | Takada et al. |
| 2012/0052396 A1 | 3/2012 | Tsuchida et al. |
| 2013/0244111 A1 | 9/2013 | Cho et al. |
| 2014/0106186 A1 | 4/2014 | Dudney et al. |

(Continued)

FOREIGN PATENT DOCUMENTS

| | | |
|---|---|---|
| EP | 2639865 A1 | 9/2013 |
| JP | 2007005073 A | 1/2007 |

(Continued)

OTHER PUBLICATIONS

Kim, et al., "Restricted growth of LiMnPO4 nanoparticles evolved from a precursor seed". Journal of Power Sources, vol. 210, pp. 1-6, 2012.

(Continued)

*Primary Examiner* — Jane Rhee
(74) *Attorney, Agent, or Firm* — Oliff PLC

(57) ABSTRACT

The main object of the present invention is to provide a cathode active material for a lithium battery capable of inhibiting resistance from increasing with time. The present invention attains the object by providing a cathode active material for a lithium battery comprising: a cathode active material containing an Mn element and being an oxide; and a coating portion formed on a surface of the cathode active material, characterized in that the coating portion contains a Li element, a P element, an O element and the Mn element derived from the cathode active material, and a ratio of the Mn element to the P element, (Mn/P) is 1 or more at an interface between the cathode active material and the coating portion.

9 Claims, 5 Drawing Sheets

(51) Int. Cl.
- *H01M 4/58* (2010.01)
- *H01M 4/62* (2006.01)
- *H01M 10/052* (2010.01)
- *H01M 10/0562* (2010.01)
- *C23C 14/34* (2006.01)
- *H01M 4/131* (2010.01)
- *H01M 4/525* (2010.01)
- *H01M 10/0525* (2010.01)
- *H01M 4/02* (2006.01)

(52) U.S. Cl.
CPC ......... *H01M 4/525* (2013.01); *H01M 4/5825* (2013.01); *H01M 4/62* (2013.01); *H01M 10/052* (2013.01); *H01M 10/0525* (2013.01); *H01M 10/0562* (2013.01); *H01M 2004/028* (2013.01); *H01M 2220/20* (2013.01); *H01M 2220/30* (2013.01); *H01M 2300/008* (2013.01); *H01M 2300/0068* (2013.01)

(58) Field of Classification Search
CPC ............... H01M 4/525; H01M 10/052; H01M 10/0562; H01M 14/34
See application file for complete search history.

(56) References Cited

U.S. PATENT DOCUMENTS

| 2014/0193689 A1 | 7/2014 | Takami et al. |
| 2014/0308572 A1* | 10/2014 | Tsuchida ............... H01M 4/505 429/162 |
| 2014/0322607 A1* | 10/2014 | Thackeray ............ H01M 4/366 429/223 |

FOREIGN PATENT DOCUMENTS

| JP | 2008-226728 A | 9/2008 |
| JP | 2010-135090 A | 6/2010 |
| JP | 2013-191540 A | 9/2013 |
| WO | 2007/004590 A1 | 1/2007 |
| WO | 2013/140565 A1 | 9/2013 |

OTHER PUBLICATIONS

Kobayashi, Yo et al., "5 V Class All-Solid-State Composite Lithium Battery with Li3PO4 Coated LINI0.5Mn1.5O4", Jounal of the Electrochemical Society, vol. 12, pp. A1577-A1582, 2003.

Sakurai Yuki et al., "Preparation of amorphous Li4SiO4—Li3PO4 thin films by pulsed laser deposition for all-solid-state lithium secondary batteries", Solid State Ionics, vol. 182, pp. 59-63, 2011.

* cited by examiner

– 1 –

CATHODE ACTIVE MATERIAL FOR LITHIUM BATTERY, LITHIUM BATTERY, AND METHOD FOR PRODUCING CATHODE ACTIVE MATERIAL FOR LITHIUM BATTERY

TECHNICAL FIELD

The present invention relates to a cathode active material for a lithium battery capable of inhibiting resistance from increasing with time.

BACKGROUND ART

In recent years, in accordance with a rapid spread of information relevant apparatuses and communication device such as a personal computer, a video camera and a portable telephone, the development of a battery to be utilized as a power source thereof has been active. The development of a high-output and high-capacity battery for an electric automobile or a hybrid automobile has been advanced also in the automobile industry. A lithium ion battery has been noticed from the view point that energy density is high among various kinds of batteries.

Conventionally, improving performance of a lithium battery while focusing on an interface of an electrode active material has been attempted in the field of such a lithium battery. For example, in Patent Literatures 1 to 3 and Non Patent Literatures 1 and 2, it is disclosed that a coating layer is formed on the surface of a cathode active material of a lithium battery.

Specifically, in Patent Literature 1, a technique for coating a lithium ion conductive oxide such as $Li_{4/3}Ti_{5/3}O_4$, $LiTi_2(PO_4)_3$ or $LiNbO_3$ on the surface of a cathode active material such as $LiCoO_2$ or $LiMn_2O_4$ by using a sol-gel method is disclosed. In Patent Literature 2, a technique for coating $Li_3PO_4$ and $Li_4SiO_4$ on the surface of a cathode active material composed of $LiCoO_2$ by using a PLD method is disclosed. In Patent Literature 3, a technique for coating $ZrO_2$, $Al_2O_3$, $TiO_2$, or the like on the surface of a cathode active material composed of $LiNiCoMnO_2$ by using a barrel sputtering method is disclosed. In Non Patent Literature 1, a technique for coating $Li_3PO_4$ on the surface of a cathode active material composed of $LiNi_{0.5}Mn_{1.5}O_4$ by using an electrostatic atomizing method is disclosed.

Incidentally, in Non Patent Literature 2, it is disclosed that both $Li_4SiO_4$ and $Li_3PO_4$ are so high in lithium concentration that it is difficult to coat them on the surface of a cathode active material by using a sol-gel method or a quenching method.

CITATION LIST

Patent Literature

Patent Literature 1: WO 2007/004590 A
Patent Literature 2: Japanese Patent Application Publication (JP-A) No. 2010-135090
Patent Literature 3: JP-A No. 2007-005073

Non Patent Literature

Non Patent Literature 1: Journal of The Electrochemical Society, 150(12) A1577-A1582(2003), "5V Class All-Solid-State Composite Lithium Battery with $Li_3PO_4$ coated $LiNi_{0.5}Mn_{1.5}O_4$"

Non Patent Literature 2: Solid State Ionics 182(2011) 59-63, "Preparation of amorphous $Li_4SiO_4$—$Li_3PO_4$ thin films by pulsed laser deposition for all-solid-state lithium secondary batteries"

SUMMARY OF INVENTION

Technical Problem

In Patent Literature 1 and Non Patent Literature 1, it is disclosed that the coating of the predetermined material on the surface of a cathode active material allows resistance to be inhibited from increasing at the initial stage; however, it is difficult to inhibit resistance from increasing with time. In Patent Literature 2, it is disclosed that a coating of a predetermined material on the surface of a cathode active material allows resistance to be inhibited from increasing with time; however, the effect may not be regarded as sufficient.

A main object of the present invention is to provide a cathode active material for a lithium battery capable of inhibiting resistance from increasing with time.

Solution to Problem

In order to solve the problems above, the present invention provides a cathode active material for a lithium battery comprising: a cathode active material containing an Mn element and being an oxide; and a coating portion formed on the surface of the cathode active material, wherein the coating portion contains a Li element, a P element, an O element and the Mn element derived from the cathode active material above, and a ratio of the Mn element to the P element, (Mn/P) is 1 or more at an interface between the cathode active material and the coating portion.

According to the present invention, the cathode active material for a lithium battery capable of inhibiting resistance from increasing with time may be obtained because the coating portion contains the Mn element derived from the cathode active material, and Mn/P is 1 or more at an interface between the cathode active material and the coating portion.

In the present invention, when a location in which a number of atoms of the P element (%) becomes maximum in a thickness direction of the coating portion is regarded as B, the Mn/P in the location B is preferably 0.79 or more. The reason is that the Mn element derived from the cathode active material is sufficiently diffused into the coating portion to allow the cathode active material for a lithium battery capable of effectively inhibiting resistance from increasing with time.

In addition, the present invention provides a lithium battery comprising a cathode active material layer, an anode active material layer, and a solid electrolyte layer formed between the cathode active material layer and the anode active material layer, wherein the cathode active material layer contains the cathode active material for a lithium battery described above, and at least one of the cathode active material layer and the solid electrolyte layer contains a sulfide solid electrolyte material.

According to the present invention, the lithium battery capable of inhibiting resistance from increasing with time may be obtained because the cathode active material layer contains the cathode active material for a lithium battery described above.

The present invention also provides a method for producing a cathode active material for a lithium battery, the cathode active material for a lithium battery comprising a cathode active material containing an Mn element and being an oxide, and a coating portion, the method comprising a step of forming the coating portion on a surface of the cathode active material by using a sputtering method, wherein the coating portion contains a Li element, a P element, an O element and the Mn element derived from the cathode active material, and a ratio of the Mn element to the P element, (Mn/P) is 1 or more at an interface between the cathode active material and the coating portion.

According to the present invention, the cathode active material for a lithium battery capable of inhibiting resistance from increasing with time may be obtained because the coating portion is formed on a surface of the cathode active material by using a sputtering method, the coating portion contains the Mn element derived from the cathode active material, and Mn/P is 1 or more at an interface between the cathode active material and the coating portion.

In the present invention, when a location in which a number of atoms of the P element (%) becomes maximum in a thickness direction of the coating portion is regarded as B, the Mn/P in the location B is preferably 0.79 or more. The reason is that the Mn element derived from the cathode active material is sufficiently diffused into the coating portion to allow the cathode active material for a lithium battery capable of effectively inhibiting resistance from increasing with time.

Advantageous Effects of Invention

The present invention exerts the effect of providing a cathode active material for a lithium battery capable of inhibiting resistance from increasing with time.

DESCRIPTION OF EMBODIMENTS

A cathode active material for a lithium battery, a lithium battery, and a method for producing a cathode active material for a lithium battery of the present invention will be hereinafter described in detail.

A. Cathode Active Material for Lithium Battery

First, a cathode active material for a lithium battery of the present invention is described. The cathode active material for a lithium battery of the present invention comprises: a cathode active material containing an Mn element and being an oxide; and a coating portion formed on a surface of the cathode active material, wherein the coating portion contains a Li element, a P element, an O element and the Mn element derived from the cathode active material, and a ratio of the Mn element to the P element, (Mn/P) is 1 or more at an interface between the cathode active material and the coating portion.

According to the present invention, the cathode active material for a lithium battery capable of inhibiting resistance from increasing with time may be obtained because the coating portion contains the Mn element derived from the cathode active material, and Mn/P is 1 or more at an interface between the cathode active material and the coating portion.

Figure 1A:
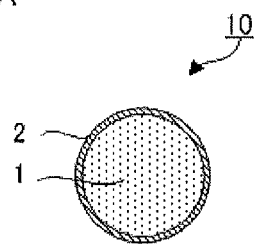
FIGS. 1A and 1B are schematic sectional views showing an example of a cathode active material for a lithium battery of the present invention.
Figure 1B:
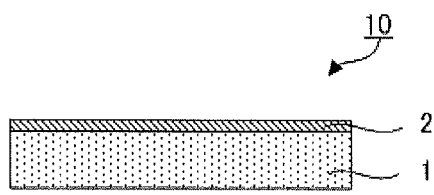

FIGS. 1A and 1B are a schematic sectional views showing an example of the cathode active material for a lithium battery of the present invention. A cathode active material for a lithium battery 10 shown in FIG. 1A comprises a particulate cathode active material 1 and a coating portion 2 having a predetermined constitution, formed on the particulate cathode active material 1. A cathode active material for a lithium battery 10 shown in FIG. 1B comprises a filmy cathode active material 1 and a coating portion 2 having a predetermined constitution, formed on the filmy cathode active material 1.

Figure 2A:
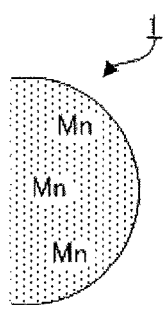
FIGS. 2A to 2C are explanatory views for explaining a cathode active material for a lithium battery of the present invention.
Figure 2B:
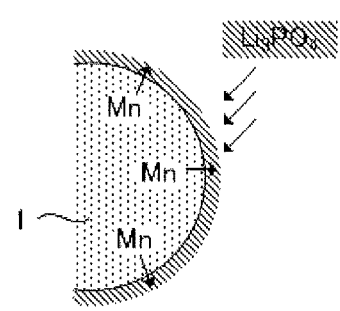
Figure 2C:
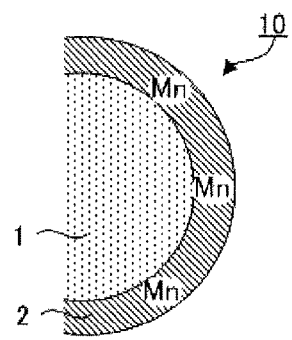
Figure 3A:
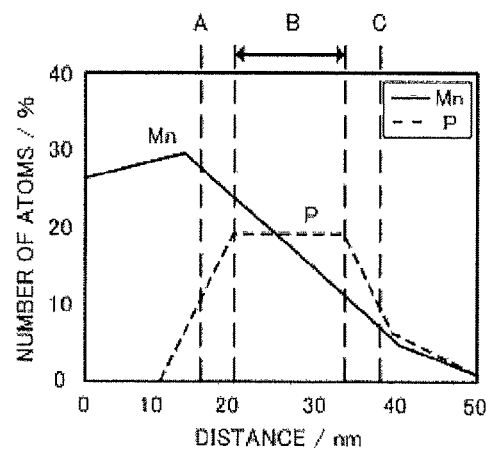
FIGS. 3A and 3B are image graphs showing a component analysis result for explaining a cathode active material for a lithium battery of the present invention.

With regard to the cathode active material for a lithium battery of the present invention, the coating portion contains a Li element, a P element, an O element and the Mn element derived from the cathode active material. As shown in FIGS. 2A to 2C, this indicates that the Mn element contained in the cathode active material 1 is diffused into a coating material (such as $Li_3PO_4$) used for forming the coating portion 2 on the occasion of forming the coating portion 2 on a surface of the cathode active material 1. The phenomenon may be confirmed by component analysis with STEM-EDX (JEOL), for example. FIG. 3A is an example of results of component analysis of the cathode active material for a lithium battery of the present invention. With regard to the cathode active material for a lithium battery of the present invention, the coating portion formed by using the coating material $Li_3PO_4$ may be confirmed by the number of atoms of the P element (%).

As shown in FIG. 3A, in observing the number of atoms of the Mn element (%) from an interface A between the cathode active material and the coating portion to the utmost surface C of the coating portion, the Mn element decreases in the number of atoms (%) as it goes from A to C; from this fact, it may be confirmed that the Mn element contained in the coating portion is derived from the cathode active material.

Figure 3B:
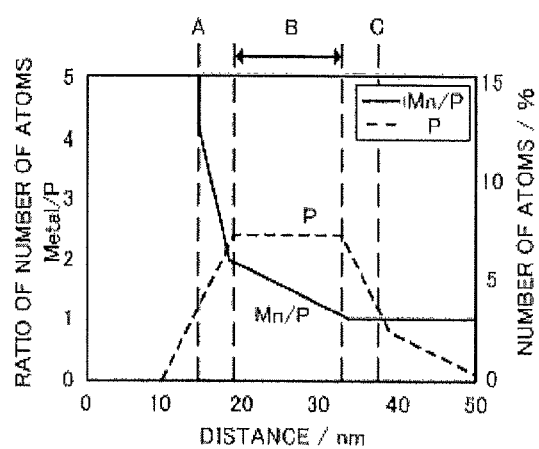

In addition, with regard to the coating portion in the present invention, as shown in FIG. 3B, the value of Mn/P is 1 or more at the interface A between the cathode active material and the coating portion. Accordingly, in the present invention, when the coating portion is formed on a surface of the cathode active material by using the coating material $Li_3PO_4$, it is guessed that a reaction such as represented by the following chemical formula is caused.

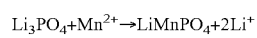

$$Li_3PO_4+Mn^{2+}\rightarrow LiMnPO_4+2Li^+$$

Thus, with regard to the coating portion in the present invention, it is guessed that an olivine-type manganese compound such as $LiMnPO_4$ is produced. In the present invention, the Mn element derived from the cathode active material is contained, so as to allow the coating portion with high stability. Accordingly, it is guessed that resistance may be inhibited from increasing with time after charge and discharge cycles by inhibiting a reaction between the cathode active material and the solid electrolyte layer or a decomposition of the solid electrolyte layer contacting with the cathode active material. Further, when the cathode active material for a lithium battery of the present invention is used for a lithium battery in which at least one of the cathode active material layer and the solid electrolyte layer contains a sulfide solid electrolyte material, the effect of the present invention such as inhibiting resistance from increasing with time after charge and discharge cycles becomes remarkable by reason of allowing the cathode active material as an oxide to be inhibited from contacting with a sulfide solid electrolyte material.

The cathode active material for a lithium battery of the present invention is hereinafter described in each constitution.

1. Coating Portion

The coating portion in the present invention is formed on a surface of the cathode active material. The coating portion contains a Li element, a P element, an O element and the Mn element derived from the cathode active material, and a ratio of the Mn element to the P element, (Mn/P) is 1 or more at an interface between the cathode active material and the coating portion.

Here, "the coating portion" in the present invention indicates what is formed on a surface of the cathode active material, and may be confirmed from the number of atoms of the P element (%) on the occasion of subjecting the cathode active material for a lithium battery to component analysis, as described above. Specifically, as shown in FIG. 3A, on the occasion of performing component analysis with STEM-EDX (JEOL), a location (nm) in which the number of atoms of the P element (%) becomes the maximum value may be specified; next, a region (distance (nm)) in which the number of atoms (%) becomes a half value or more of the maximum value while including the location (nm) in which the number of atoms of the P element (%) becomes the maximum value may be specified as the coating portion. Accordingly, for example, in the cathode active material for a lithium battery shown in FIG. 3A, the maximum value of the number of atoms of the P element is 19%, so that a region of from 17 nm to 38 nm in which the number of atoms becomes a half value of 19%, namely, 9.5% or more while including the location (22 nm to 33 nm) in which the number of atoms is 19% may be specified as the coating portion.

"An interface between the cathode active material and the coating portion" in the present invention indicates a location A (17 nm) on the side on which the number of atoms of the Mn element (%) is larger in a region (17 nm to 38 nm) in which the number of atoms of the P element (%) becomes a half value (9.5%) or more of the maximum value (19%), as shown in FIGS. 3A and 3B, for example.

The coating portion in the present invention is not particularly limited as long as the coating portion contains a Li element, a P element, an O element and the Mn element derived from the cathode active material, but preferably has a $PO_4^{3-}$ structure, for example. Specifically, the coating portion preferably contains $LiMnPO_4$. In other words, $Li_3PO_4$ is preferably selected as a coating material used for forming the coating portion and reacted with Mn contained in the cathode active material. The reason is to allow the coating portion with high stability at high voltage.

The cathode active material for a lithium battery of the present invention is not particularly limited as long as a ratio of the Mn element to the P element, (Mn/P) is 1 or more at an interface between the cathode active material and the coating portion, for example, the location of A in FIG. 3B. Above all, the value of Mn/P is preferably 2 or more, more preferably 3 or more, and particularly more preferably 4 or more. The value of Mn/P is preferably 10 or less and more preferably 5 or less. When the value of Mn/P is too large, it may bring a great structural change of the cathode active material, resulting in increasing resistance. Because the ratio of the Mn element to the P element, (Mn/P) is within the range at an interface between the cathode active material and the coating portion, the following reaction, for example, may be caused.

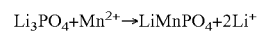

$Li_3PO_4 + Mn^{2+} \rightarrow LiMnPO_4 + 2Li^+$

In the present invention, since the coating portion contains the Mn element as $LiMnPO_4$, the coating portion with high stability at high voltage can be obtained, and resistance can be inhibited from increasing with time. With regard to the coating portion in the present invention, a region in which Mn/P is 1 or more is preferably 3 nm or more from an interface between the cathode active material and the coating portion, more preferably 6 nm or more from an interface between the cathode active material and the coating portion, particularly preferably 10 nm or more from an interface between the cathode active material and the coating portion. Because Mn/P is 1 or more in the range, the Mn element derived from the cathode active material can be sufficiently diffused into the coating portion and resistance can be effectively inhibited from increasing with time. Incidentally, the value of Mn/P may be calculated from the number of atoms (%), which is the number of atoms of the Mn element and the P element (%) measured by energy-dispersive X-ray spectrometry (EDX), for example.

In addition, with regard to the cathode active material for a lithium battery of the present invention, the value of Mn/P in a location (distance (nm)) in which the number of atoms of the P element (%) becomes the maximum value in a thickness direction of the coating portion, for example, in the location of B in which the number of atoms of the P element becomes 19% in FIG. 3B is preferably 0.79 or more. The value of Mn/P in the location of B is preferably 2 or less. The value of Mn/P in the location is within the range, so as to allow the Mn element derived from the cathode active material to be sufficiently diffused into the coating portion and allow resistance to be inhibited from increasing with time.

Furthermore, with regard to the cathode active material for a lithium battery of the present invention, the value of Mn/P on the utmost surface of the coating portion, for example, in the location of C opposite to an interface A with the cathode active material in FIGS. 3A and 3B is preferably 0.5 or more. The value of Mn/P in the location of C is preferably 2 or less, above all, preferably 1.5 or less. The value of Mn/P in the location is within the range, so as to allow the Mn element derived from the cathode active material to be sufficiently diffused into the coating portion and allow resistance to be inhibited from increasing with time.

With regard to the cathode active material for a lithium battery of the present invention, the value of Mn/P from an interface between the cathode active material and the coating portion to a location (distance (nm)) in which the number of atoms of the P element (%) becomes the maximum value in a thickness direction of the coating portion, for example, from the location of A to the location of B in which the number of atoms of the P element becomes 19% in FIG. 3B is preferably 1 or more, above all, preferably 1.2 or more, particularly, preferably 1.5 or more. The value of Mn/P in the location is within the range, so as to allow the Mn element derived from the cathode active material to be sufficiently diffused into the coating portion and allow resistance to be effectively inhibited from increasing with time. Incidentally, with regard to the location of B in this case, for example, when a location (distance (nm)) in which the number of atoms of the P element (%) becomes the maximum value in a thickness direction of the coating portion is plural, the location closest to the cathode active material among them is regarded as the location of B. Thus, for example, a location in which the number of atoms of the P element (%) becomes the maximum value (19%) ranges from 22 nm to 33 nm in FIG. 3B, so that the location of 22 nm closest to the cathode active material among them is regarded as B.

In addition, the value of Mn/P of the coating portion in the present invention, for example, a range corresponding to A to C in FIG. 3B is preferably within a range of $0.79 \leq Mn/P \leq 4.1$. The value of Mn/P in the coating portion is within the range, so as to allow resistance to be inhibited from increasing with time.

The average thickness of the coating portion is not particularly limited as long as the effect of the present invention allows resistance to be inhibited from increasing with time is obtained, but is, for example, preferably within a range of 1 nm to 50 nm, above all, preferably within a range of 3 nm to 40 nm, particularly, preferably within a range of 5 nm to 30 nm. The case where the average thickness of the coating portion is too thin brings a possibility that the cathode active material and the electrolyte layer react, while when the average thickness of the coating portion is too thick brings a possibility that ion conductivity deteriorates. Incidentally, the average thickness of the coating portion may be measured by using a transmission electron microscope (TEM), for example.

The coverage factor of the coating portion on a surface of the cathode active material is preferably high. Specifically, the coverage factor is preferably 50% or more, above all, preferably 80% or more. The coating portion may cover the whole surface of the cathode active material. Incidentally, the coverage factor of the coating portion may be measured by using a transmission electron microscope (TEM) and an X-ray photoelectron spectrometry (XPS), for example.

2. Cathode Active Material

The cathode active material in the present invention is not particularly limited as long as the cathode active material contains an Mn element, is an oxide and functions as a cathode active material for a lithium battery. Specific examples thereof include rock salt bed type active materials such as $LiNi_{1/3}Co_{1/3}Mn_{1/3}O_2$, $LiMnO_2$ and $LiNi_{1/2}Mn_{1/2}O_2$, spinel type active materials such as $LiMn_2O_4$ and $LiNi_{0.5}Mn_{1.5}O_4$, olivine type active materials such as $LiMnPO_4$, and solid solution type active materials containing $Li_2MnO_3$. Among them, $LiNi_{1/3}CO_{1/3}Mn_{1/3}O_2$ or $LiNi_{0.5}Mn_{1.5}O_4$ is preferable. Si-containing oxides such as $Li_2MnSiO_4$ may be used as the cathode active material other than those mentioned above.

The cathode active material in the present invention is preferably a high-voltage cathode active material. The reason is that the effect of the present invention such as to allow resistance to be inhibited from increasing with time becomes remarkable. The charging potential of the cathode active material in the present invention is preferably 4.5 V or more, above all, preferably 4.55 V or more, particularly, preferably 4.6 V or more with respect to Li metal potential.

Examples of the shape of the cathode active material include a particulate shape as FIG. 1A. The average particle diameter ($D_{50}$) of the particles is, for example, preferably from 0.1 µm to 50 µm. Other examples of the shape of the cathode active material include a thin film as FIG. 1B. The thickness of the thin film is, for example, preferably within a range of 10 nm to 1 µm.

B. Lithium Battery

Next, a lithium battery of the present invention is described. The lithium battery of the present invention is a lithium battery comprising a cathode active material layer, an anode active material layer, and a solid electrolyte layer formed between the cathode active material layer and the anode active material layer, wherein the cathode active material layer contains the cathode active material for a lithium battery described above, and at least one of the cathode active material layer and the solid electrolyte layer contains a sulfide solid electrolyte material. The lithium battery of the present invention is hereinafter described while referring to FIG.

Figure 4:
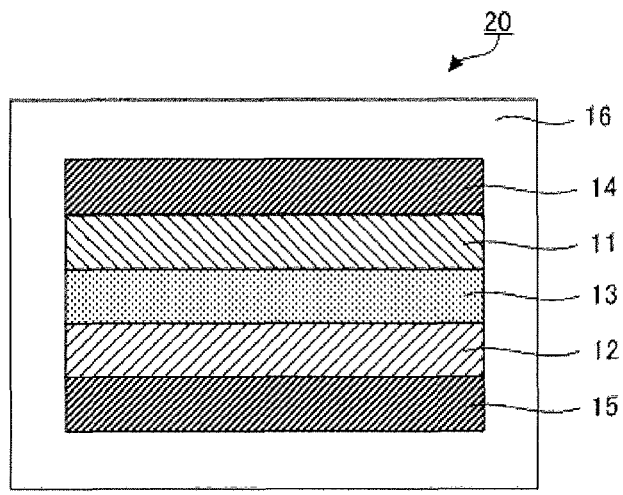
FIG. 4 is a schematic sectional view showing an example of a lithium battery of the present invention.

FIG. 4 is a schematic sectional view showing an example of the lithium battery of the present invention. A lithium battery 20 shown in FIG. 4 comprises a cathode active material layer 11, an anode active material layer 12, an electrolyte layer 13 formed between the cathode active material layer 11 and the anode active material layer 12, a cathode current collector 14 for collecting the cathode active material layer 11, an anode current collector 15 for collecting the anode active material layer 12, and a battery case 16 for storing these members. With regard to the lithium battery 20 in the present invention, the cathode active material layer 11 contains the cathode active material for a lithium battery described above.

According to the present invention, the lithium battery capable of inhibiting resistance from increasing with time may be obtained because the cathode active material layer contains the cathode active material for a lithium battery described above.

The lithium battery of the present invention is hereinafter described in each constitution.

1. Cathode Active Material Layer

The cathode active material layer in the present invention is a layer containing at least the cathode active material for a lithium battery, and may further contain at least one of an electrolyte material, a conductive material and a binder as required. In the present invention, at least one of the cathode active material layer and the after-mentioned solid electrolyte layer contains a sulfide solid electrolyte material. The reason is that resistance may be inhibited from increasing with time after charge and discharge cycles by inhibiting a decomposition of the cathode active material layer and the solid electrolyte layer contacting with the cathode active material.

The cathode active material for a lithium battery in the present invention is as described in the "A. Cathode active material for lithium battery". The cathode active material layer preferably contains an electrolyte material. The reason is to allow Li ion conductivity in the cathode active material layer to be improved. Incidentally, the electrolyte material contained in the cathode active material layer is the same as the solid electrolyte material described in the after-mentioned "3. Solid electrolyte layer".

The cathode active material layer in the present invention may further contain a conductive material. The addition of the conductive material allows electrical conductivity of the cathode active material layer to be improved. Examples of the conductive material include carbon materials such as acetylene black, Ketjen Black and carbon fiber, and metal materials. The cathode active material layer may further contain a binder. Examples of the binders include fluorine-containing binders such as PTFE and PVDF. The thickness of the cathode active material layer varies with the constitution of an intended lithium battery, and is preferably within a range of 0.1 µm to 1000 µm, for example.

2. Anode Active Material Layer

The anode active material layer in the present invention is a layer containing at least an anode active material, and may further contain at least one of an electrolyte material, a conductive material and a binder, as required.

Examples of the anode active material include a metal active material and a carbon active material. Examples of the metal active material include Li alloy, In, Al, Si, and Sn. On the other hand, examples of the carbon active material include graphite such as mesocarbon microbeads (MCMB) and high orientation property graphite (HOPG), and amorphous carbon such as hard carbon and soft carbon. Incidentally, SiC may be also used as the anode active material.

The anode active material layer preferably contains an electrolyte material. The reason is to allow Li ion conductivity in the anode active material layer to be improved. Incidentally, the electrolyte material contained in the anode active material layer is the same as the solid electrolyte material described in the after-mentioned "3. Solid electrolyte layer".

Incidentally, a conductive material and a binder used for the anode active material layer are the same as the case of the cathode active material layer described above. The thickness of the anode active material layer varies with the constitution of an intended lithium battery, and is preferably from 0.1 µm to 1000 µm, for example.

3. Solid Electrolyte Layer

The solid electrolyte layer in the present invention is a layer formed between the cathode active material layer and the anode active material layer, and a layer containing at least a solid electrolyte material. Ion conduction between the cathode active material and the anode active material is performed through the electrolyte contained in the solid electrolyte layer. In the present invention, at least one of the cathode active material layer described above and the solid electrolyte layer contains a sulfide solid electrolyte material. The reason is that resistance may be inhibited from increasing with time after charge and discharge cycles by inhibiting a decomposition of the cathode active material layer and the solid electrolyte layer contacting with the cathode active material.

The solid electrolyte material is not particularly limited as long as the material has Li ion conductivity, but examples thereof include a sulfide solid electrolyte material, an oxide based solid electrolyte material, a nitride solid electrolyte material and a halide solid electrolyte material; among them, preferably a sulfide solid electrolyte material. The reason is to be high in Li ion conductivity as compared with an oxide based solid electrolyte material. Incidentally, a sulfide solid electrolyte material is so higher in reactivity than an oxide based solid electrolyte material as to easily react with the cathode active material and easily form a high resistive layer at an interface with the cathode active material.

Examples of the sulfide solid electrolyte particles include $Li_2S-P_2S_5$, $Li_2S-P_2S_5-LiI$, $Li_2S-P_2S_5-Li_2O$, $Li_2S-P_2S_5-Li_2O-LiI$, $Li_2S-SiS_2$, $Li_2S-SiS_2-LiI$, $Li_2S-SiS_2-LiBr$, $Li_2S-SiS_2-LiCl$, $Li_2S-SiS_2-B_2S_3-LiI$, $Li_2S-SiS_2-P_2S_5-LiI$, $Li_2S-B_2S_3$, $Li_2S-P_2S_5-Z_mS_n$ (in which, "m" and "n" represent a positive number, and Z represents any one of Ge, Zn, and Ga), $Li_2S-GeS_2$, $Li_2S-SiS_2-Li_3PO_4$, and $Li_2S-SiS_2-Li_xMO_y$ (in which, "x" and "y" represent a positive number, and M represents anyone of P, Si, Ge, B, Al, Ga, and In). The wording "$Li_2S-P_2S_5$" means the sulfide solid electrolyte material using a raw material composition containing $Li_2S$ and $P_2S_5$, and the same expression rule applies to others as well.

Meanwhile, examples of the oxide based solid electrolyte material include a NASICON-type oxide, a garnet-type oxide and a perovskite-type oxide. Examples of the NASICON-type oxide include an oxide containing Li, Al, Ti, P and O (such as $Li_{1.5}Al_{0.5}Ti_{1.5}(PO_4)_3$) and an oxide containing Li, Al, Ge, P and O (such as $Li_{1.5}Al_{0.5}Ge_{1.5}(PO_4)_3$). Examples of the garnet-type oxide include an oxide containing Li, La, Zr and O (such as $Li_7La_3Zr_2O_{12}$). Examples of the perovskite-type oxide include an oxide containing Li, La, Ti and O (such as $LiLaTiO_3$).

The solid electrolyte material may be crystalline, amorphous or glass ceramics (crystallized glass).

Examples of the shape of the solid electrolyte material include a particulate shape. When the solid electrolyte material is in a particulate shape, the average particle diameter thereof ($D_{50}$) is, for example, preferably from 0.01 µm to 40 µm, more preferably from 0.1 µm to 20 µm. Li ion conductance of the solid electrolyte material at 25° C. is, for example, preferably $1 \times 10^{-4}$ S/cm or more, more preferably $1 \times 10^{-3}$ S/cm or more.

The thickness of the solid electrolyte layer is not particularly limited but is, for example, preferably from 0.1 µm to 1000 µm, more preferably from 0.1 µm to 300 µm.

4. Other Constitutions

The lithium battery in the present invention comprises at least the cathode active material layer, anode active material layer and solid electrolyte layer described above, ordinarily further comprising a cathode current collector for collecting the cathode active material layer and an anode current collector for collecting the anode active material layer. Also, a battery case of a general lithium battery may be used for a battery case used for the present invention.

5. Lithium Battery

The lithium battery in the present invention may be a primary battery or a secondary battery, preferably a secondary battery among them. The reason is to be repeatedly charged and discharged and be useful as a car-mounted battery, for example. Examples of the shape of the lithium battery in the present invention include a coin shape, a laminate shape, a cylindrical shape and a rectangular shape.

C. Method for Producing Cathode Active Material for Lithium Battery

Next, a method for producing a cathode active material for a lithium battery of the present invention is described. The present invention provides a method for producing a cathode active material for a lithium battery, the cathode active material for a lithium battery comprises a cathode active material containing an Mn element and being an oxide, and a coating portion, the method comprising a step of forming the coating portion on a surface of the cathode active material by using a sputtering method, wherein the coating portion contains a Li element, a P element, an O element and the Mn element derived from the cathode active material, and a ratio of the Mn element to the P element, (Mn/P) is 1 or more at an interface between the cathode active material and the coating portion.

According to the present invention, the cathode active material for a lithium battery capable of inhibiting resistance from increasing with time may be obtained because the coating portion containing the Mn element derived from cathode active material, in which Mn/P at an interface with the cathode active material is 1 or more, is formed by using a sputtering method, the coating portion is formed on a surface of the cathode active material, the coating portion contains the Mn element derived from the cathode active material, and Mn/P is 1 or more.

The reason is conceived to be as follows. With regard to the method for producing a cathode active material for a lithium battery of the present invention, a sputtering method is used for forming the coating portion on a surface of the cathode active material by using a coating material ($Li_3PO_4$). The sputtering method is a method requiring comparatively high energy, and has a characteristic that a film may be formed by shooting a target at a velocity by approximately fifty times as compared with an evaporation method. Thus, in the present invention in which the coating portion is formed by a sputtering method, it is conceived that $Li_3PO_4$ and the cathode active material may be reacted. The present invention can form the coating portion in which Mn/P is 1 or more based on a new idea of reacting the cathode active material and the coating material, which has not conventionally been offered; as a result, it is conceived that resistance may be inhibited from increasing with time. In addition, the present invention is properly adjusted so that Mn/P in the coating portion is 1 or more.

In the present invention, examples of the coating material used for forming the coating portion containing a Li element, a P element and an O element include $Li_3PO_4$. $Li_3PO_4$ is known as a material with a high ratio of lithium ions. In this way, in the case of using $Li_3PO_4$ with a high ratio of lithium ions as the coating material, it is difficult to form the coating portion on a surface of the cathode active material by using a sol-gel method and a quenching method (Non Patent Literature 2). On the contrary, in the present invention, the use of a sputtering method allows the coating portion to be formed on a surface of the cathode active material while using $Li_3PO_4$ as the coating material. Incidentally, in the case of forming the coating portion by using a sol-gel method and a quenching method while using $Li_3PO_4$ with a high ratio of lithium ions as the coating material, the following problem is caused. That is to say, the problem is caused that basicity of $Li_3PO_4$ becomes so high as to easily degenerate by reacting with acid gas such as $CO_2$ existing in the air. For example, in the case of degenerating by reacting with $CO_2$, $Li_3PO_4$ turns into $Li_2CO_3$, having high resistance, resulting in increasing interface resistance of a lithium battery.

The effect of the cathode active material for a lithium battery obtained by the present invention is the same as the contents described in the item of "A. Cathode active material for lithium battery"; therefore, the description herein is omitted.

The method for producing a cathode active material for a lithium battery of the present invention is hereinafter described.

1. Coating Portion Forming Step

The coating portion forming step in the present invention is a step of forming the coating portion on a surface of the cathode active material by using a sputtering method. In this step, a desired coating portion may be formed by coating a coating material on a surface of the cathode active material by using a sputtering method.

(1) Sputtering Method

The sputtering method in this step is not particularly limited as long as the method can coat the coating material on the surface of the cathode active material to form a desired coating portion. Examples thereof include a barrel sputtering method, a magnetron sputtering method, a reactive sputtering method, a pole-pole array, and an ion beam sputtering method; in this step, a barrel sputtering method is preferably used. The reason is that the formation of the coating portion by using a barrel sputtering method allows Mn derived from the cathode active material to be sufficiently diffused into the coating portion. Also, the reason is to allow particulates or a thin film to be uniformly coated.

(2) Coating Material

In this step, the coating portion is formed by coating a coating material on a surface of the cathode active material. $Li_3PO_4$ composing the coating portion formed in the present step is used for the coating material to be then used.

Examples of the coating material used in the step include $Li_xPO_y$ ($2 \leq x \leq 4$, $3 \leq y \leq 5$); specifically, $Li_3PO_4$.

2. Other Steps

With regard to the method for producing a cathode active material for a lithium battery of the present invention, necessary steps except the coating portion forming step described above may be properly selected and added. For example, the method may have a drying step of drying the cathode active material with the coating portion formed.

3. Cathode Active Material for Lithium Battery

The cathode active material for a lithium battery produced by the present invention is described in the item of "A. Cathode active material for lithium battery" described above; therefore, the description herein is omitted.

Incidentally, the present invention is not intended to be limited to the embodiment described above. The embodiment described above is given only for illustrative purposes, and any embodiment having substantially the same configuration as the technical idea described in the claims of the present invention and provides similar operating effects, is construed to be included in the technical scope of the present invention.

EXAMPLES

Hereinafter, the present invention will be described more specifically by way of Examples.

Example 1

Production of Cathode Active Material for Lithium Battery

A powdery cathode active material ($LiNi_{0.5}Mn_{1.5}O_4$, NICHIA CORPORATION) was prepared and a coating portion was formed on a surface of the cathode active material by a powder barrel sputtering method while using a coating material ($Li_3PO_4$ target (Toshima Manufacturing Co., Ltd.)). A cathode active material for a lithium battery was thus obtained. Incidentally, the average thickness of the coating portion was 10 nm.

Thereafter, the cathode active material for a lithium battery obtained in the above was dried for 10 hours under a sufficiently exhausted atmosphere. Incidentally, the temperature at this time was 120° C.

(Production of Cathode Mixture)

$LiNi_{0.5}Mn_{1.5}O_4$ obtained by the production of cathode active material for lithium battery described above, LiI—

$Li_2S$—$P_2S_5$ (solid electrolyte) and carbon nanotube (VGCF-H™, conductive material, Showa Denko K.K.) were mixed at a ratio of $LiNi_{0.5}Mn_{1.5}O_4$:LiI—$Li_2S$—$P_2S_5$:carbon nanotube=50:50:5 (volume ratio) to obtain a powdery cathode mixture.

(Production of Anode Mixture)

Graphite (anode active material, Mitsubishi Chemical Corporation) and LiI—$Li_2S$—$P_2S_5$ (solid electrolyte) were mixed at a ratio of graphite:LiI—$Li_2S$—$P_2S_5$=50:50 (volume ratio) to obtain an anode mixture.

(Production of Solid Electrolyte Layer)

A solid electrolyte layer composed of LiI—$Li_2S$—$P_2S_5$ was produced.

(Production of Current Collector)

A current collector was produced by using stainless steel.

(Production of Evaluation Battery)

Put in a cylinder made of macole was 65 mg of electrolyte powder and pressed at 1 ton/cm$^2$, and 19.4 mg of the cathode mixture powder was put thereon and pressed at 1 ton/cm$^2$, and 11.9 mg of the anode mixture powder was put on the other side thereof and pressed at 4 ton/cm$^2$, and thereafter clamped at a torque of 6 N·m by three bolts, and put in a closed vessel to produce a battery, which was subject to charge and discharge evaluation.

Example 2

An evaluation battery was produced in the same manner as Example 1 except for using $LiNi_{1/3}Co_{1/3}Mn_{1/3}O_2$ as the cathode active material.

Comparative Example 1

An evaluation battery was produced in the same manner as Example 1 except for forming the coating portion by coating a coating material ($LiNbO_3$) on a surface of the cathode active material by using a sol-gel method. Incidentally, a sol-gel method was performed in the following manner. First, $LiOC_2H_5$ (manufactured by Kojundo Chemical Lab. Co., Ltd.), $Nb(OC_2H_5)_5$ (manufactured by Kojundo Chemical Lab. Co., Ltd.) and dehydrated ethanol (manufactured by KANTO CHEMICAL CO., INC.) were mixed to prepare a coating liquid. Next, coating treatment was performed for the cathode active material ($LiNi_{0.5}Mn_{1.5}O_4$, NICHIA CORPORATION) with a target thickness of 10 nm by using a tumbling flow layer coating apparatus MP01™ manufactured by powrex corp. Thereafter, heat treatment was performed at 350° C. for 20 hours.

Comparative Example 2

An evaluation battery was produced in the same manner as Example 2 except for forming the coating portion by coating a coating material ($LiNbO_3$) on a surface of the cathode active material by using a sol-gel method. Incidentally, a sol-gel method was performed in the same manner as Comparative Example 1.

[Evaluation 1]

(Evaluation of Resistance During Charge and Discharge Cycles)

The evaluation of resistance during charge and discharge cycles was performed by using the evaluation batteries obtained in Examples 1 and 2 and Comparative Examples 1 and 2. Specifically, first, charging was performed at a current of 0.1 C (0.1836 mA/cm$^2$) until against-lithium metal potential of the cathode became 5.0 V, and charging was finished when the current became 0.01 C or 20 hours passed. Next, discharging was performed at a current of 0.1 C until against-lithium metal potential of the cathode became 3.6 V in Example 1 and 3.1 V in Example 2, and discharging was finished when the current became 0.01 C or 20 hours passed. Such a cycle was performed at 25° C. once. The evaluation batteries obtained in Examples 1 and 2 and Comparative Examples 1 and 2 were discharged at 25° C. and constant current from a charged state to 20% of the capacity, and resistance was calculated from voltage drop at that time. Subsequently, charging was performed at a current of 1 C in the same voltage range, and charging was finished when the current became 0.01 C or 1 hour passed. Next, discharging was performed at a current of 1 C until against-lithium metal potential of the cathode became 3.6 V in Example 1 and 3.1 V in Example 2, and discharging was finished when the current became 0.01 C or 20 hours passed. Such a cycle was repeated at 60° C. twenty times. The evaluation batteries obtained in Examples 1 and 2 and Comparative Examples 1 and 2 were discharged at 25° C. and constant current from a charged state to 20% of the capacity, and resistance was calculated from voltage drop at that time.

The resistance values of Examples 1 and 2 and Comparative Examples 1 and 2 after twenty cycles were shown in Table 1. As shown in Table 1, the resistance values of Example 1 and Example 2 where the coating material $Li_3PO_4$ was coated on a surface of the cathode active material by using a barrel sputtering method were 390Ω and 533Ω, respectively. In contrast, the resistance value of Comparative Example 1 and Comparative Example 2 such that the coating material $LiNbO_3$ was coated on a surface of the cathode active material by using a sol-gel method was 2246Ω and 610Ω, respectively. In comparing Examples 1 and 2 with Comparative Examples 1 and 2, both of the resistance values of Examples 1 and 2 were lower than those of Comparative Examples 1 and 2.

TABLE 1

|  | Cathode active material | Coating material | Resistance value* (Ω) |
| --- | --- | --- | --- |
| Example 1 | $LiNi_{0.5}Mn_{1.5}O_4$ | $Li_3PO_4$ | 390 |
| Example 2 | $LiNi_{1/3}Co_{1/3}Mn_{1/3}O_2$ | $Li_3PO_4$ | 533 |
| Comparative Example 1 | $LiNi_{0.5}Mn_{1.5}O_4$ | $LiNbO_3$ | 2246 |
| Comparative Example 2 | $LiNi_{1/3}Co_{1/3}Mn_{1/3}O_2$ | $LiNbO_3$ | 610 |

*Resistance value (Ω) denotes value of resistance after 20 cycles.

Figure 5A:
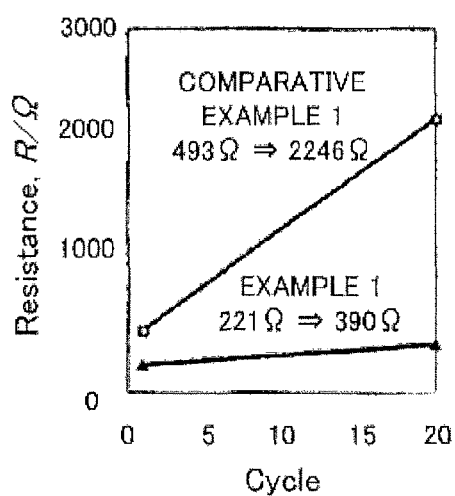
FIGS. 5A and 5B are graphs showing resistance during charge and discharge cycles of Examples 1 and 2 and Comparative Examples 1 and 2.
Figure 5B:
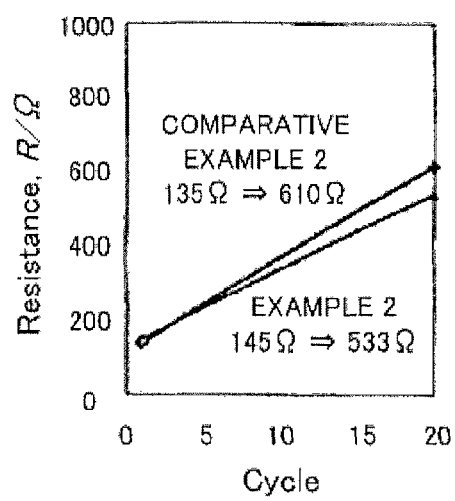

Next, the increases of resistance with time of Examples 1 and 2 and Comparative Examples 1 and 2 were evaluated. FIG. 5A is a graph showing resistance during charge and discharge cycles of Example 1 and Comparative Example 1, and FIG. 5B is a graph showing resistance during charge and discharge cycles of Example 2 and Comparative Example 2. As shown in FIG. 5A, in comparing Example 1 and Comparative Example 1 where $LiNi_{0.5}Mn_{1.5}O_4$ was used for the cathode active material, with regard to Example 1, the initial resistance value was 221Ω, the resistance value after twenty cycles was 390Ω and the difference therebetween 169Ω; meanwhile, with regard to Comparative Example 1, the initial resistance value was 493Ω, the resistance value after twenty cycles was 2246Ω and the difference therebetween 1753Ω. As shown in FIG. 5B, in comparing Example 2 and Comparative Example 2 such that $LiNi_{1/3}Co_{1/3}Mn_{1/3}O_2$ was used for the cathode active material, with regard to Example 2, the initial resistance value was 145Ω, the resistance value after twenty cycles was 533Ω and the difference therebetween 388Ω; meanwhile, with regard to Comparative Example 2, the initial resistance value was 135Ω, the resistance value after twenty cycles was 610Ω and the difference therebetween 475Ω. From this result, it was found that resistance increased with time after charge and discharge cycles in the case of Comparative Examples 1 and 2, whereas resistance could be inhibited from increasing with time in the case of Examples 1 and 2, as compared with Comparative Examples 1 and 2.

[Evaluation 2]

(Evaluation of Composition)

The component analysis of the cathode active material for a lithium battery was performed by using STEM-EDX (JEOL).

Figure 6A:
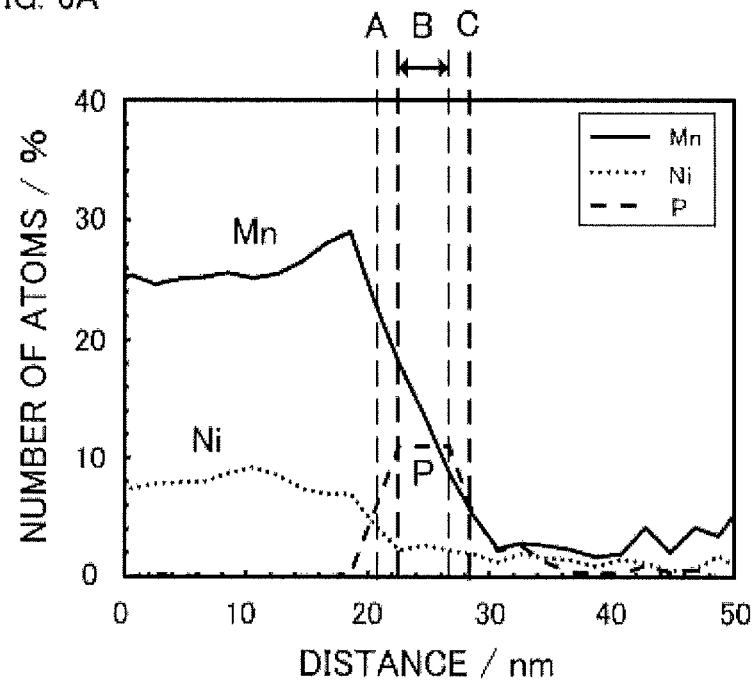
FIGS. 6A and 6B are graphs showing a result of component analysis of Example 1.
Figure 6B:
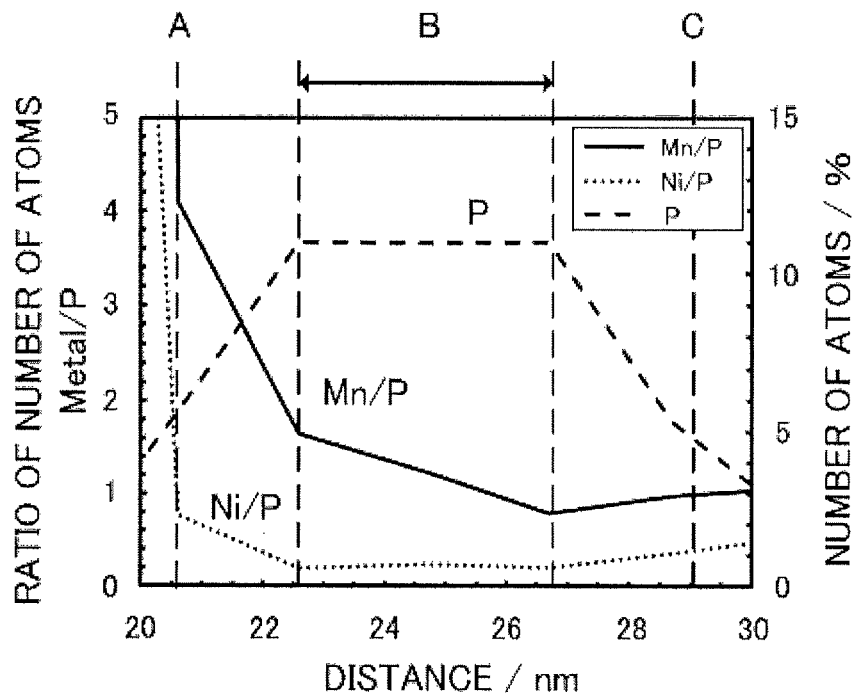

The component analysis result of Example 1 was shown in FIGS. 6A and 6B and Table 2. As shown in FIG. 6A and Table 2, through the number of atoms of the Mn element and the Ni element contained in the cathode active material and the number of atoms of the P element contained in the coating material, it was confirmed that the coating portion with an average thickness of 8.4 nm was formed on a surface of the cathode active material. It was found that the coating portion formed by a sputtering method contained the Mn element derived from the cathode active material. In addition, as shown in FIG. 6B and Table 2, the ratio of the Ni element to the P element, (Ni/P) contained in the coating portion of Example 1 was 0.76 at an interface between the cathode active material and the coating portion, namely, in the location of A of FIG. 6B, whereas the ratio of the Mn element to the P element, (Mn/P) was 4.1. In this way, with regard to the cathode active material for a lithium battery of the present invention, it was obvious that the Mn element derived from the cathode active material was diffused into the coating portion. The value of Mn/P at an interface between the cathode active material and the coating portion was 1 or more, so that it was found that the following reaction might be caused.

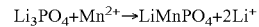

$$Li_3PO_4 + Mn^{2+} \rightarrow LiMnPO_4 + 2Li^+$$

TABLE 2

|  | A | B | C | A − C |
|---|---|---|---|---|
| Distance (nm) | 20.6 | 22.6-26.7 | 29 | 8.4 |
| Number of atoms of P element (%) | 5.6 | 11 | 4.9 | 4.9 ≤ P ≤ 11 |
| Mn/P Ratio of number of atoms (—) | 4.1 | 0.79-1.6 | 1.0 | 0.79 ≤ Mn/P ≤ 4.1 |
| Ni/P Ratio of number of atoms (—) | 0.76 | 0.2-0.24 | 0.39 | 0.20 ≤ Ni/P ≤ 0.76 |

Figure 7A:
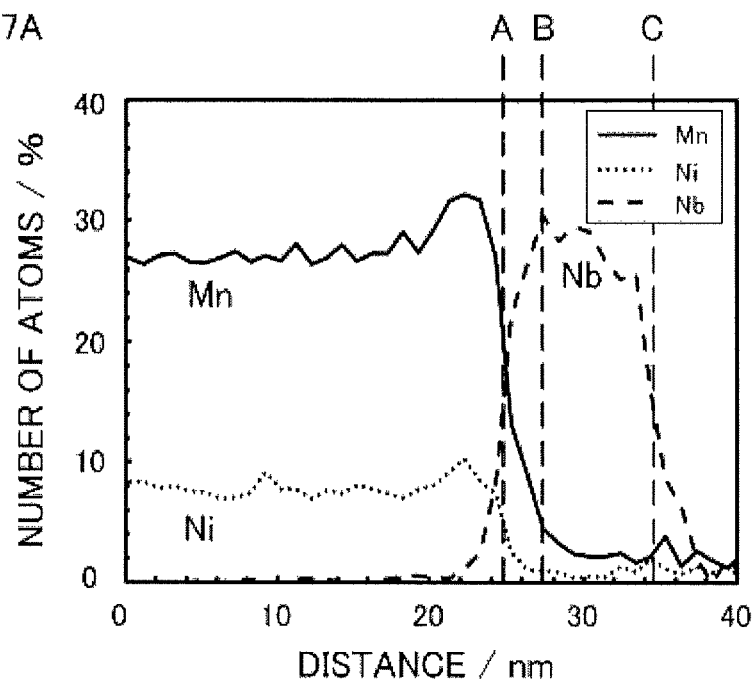
FIGS. 7A and 7B are graphs showing a result of component analysis of Comparative Example 1.
Figure 7B:
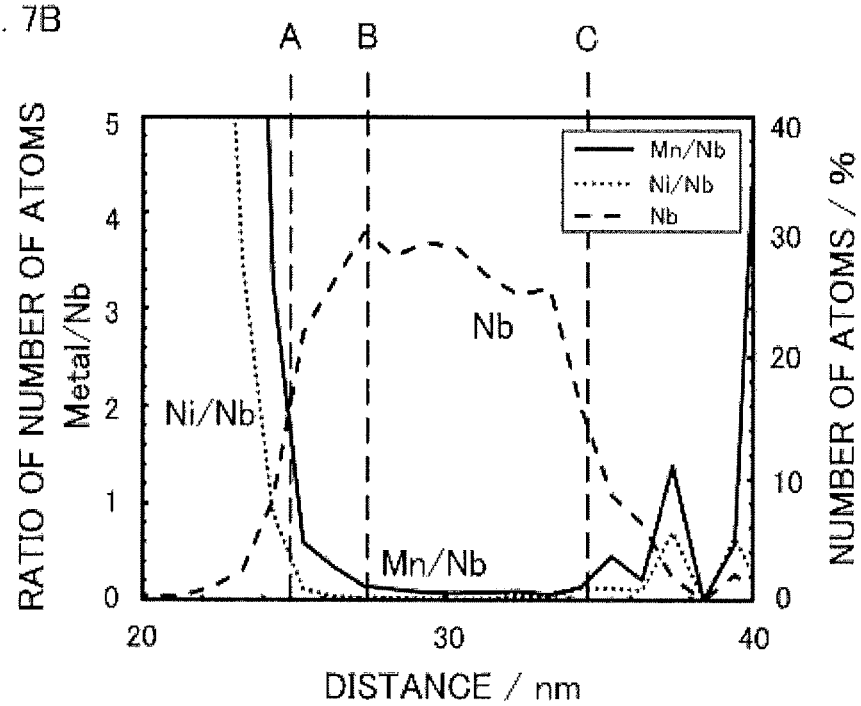

The component analysis result of Comparative Example 1 was shown in FIGS. 7A, 7B and Table 3. As shown in FIG. 7A and Table 3, through the number of atoms of the Mn element and the Ni element contained in the cathode active material and the number of atoms of the Nb element contained in the coating material, it was confirmed that the coating portion with an average thickness of 9.6 nm was formed on a surface of the cathode active material. The coating portion of Comparative Example 1 formed by a sol-gel method with the coating material $LiNbO_3$ scarcely contains the Mn element derived from the cathode active material. As shown in FIG. 7B and Table 3, the ratio of the Mn element to the Nb element, (Mn/Nb) and the ratio of the Ni element to the Nb element, (Ni/Nb) contained in the coating portion of Comparative Example 1 were 2.0 and 0.49 respectively at an interface between the cathode active material and the coating portion, namely, in the location of A of FIG. 7B.

TABLE 3

|  | A | B | C | A − C |
|---|---|---|---|---|
| Distance (nm) | 24.8 | 27.3 | 34.4 | 9.6 |
| Number of atoms of Nb element (%) | 16.0 | 30.3 | 15.9 | 15.9 ≤ Nb ≤ 30.3 |
| Mn/Nb Ratio of number of atoms (—) | 2.0 | 0.15 | 0.14 | 0.064 ≤ Mn/Nb ≤ 2.0 |
| Ni/Nb Ratio of number of atoms (—) | 0.49 | 0.03 | 0.12 | 0.011 ≤ Ni/Nb ≤ 0.51 |

Figure 8A:
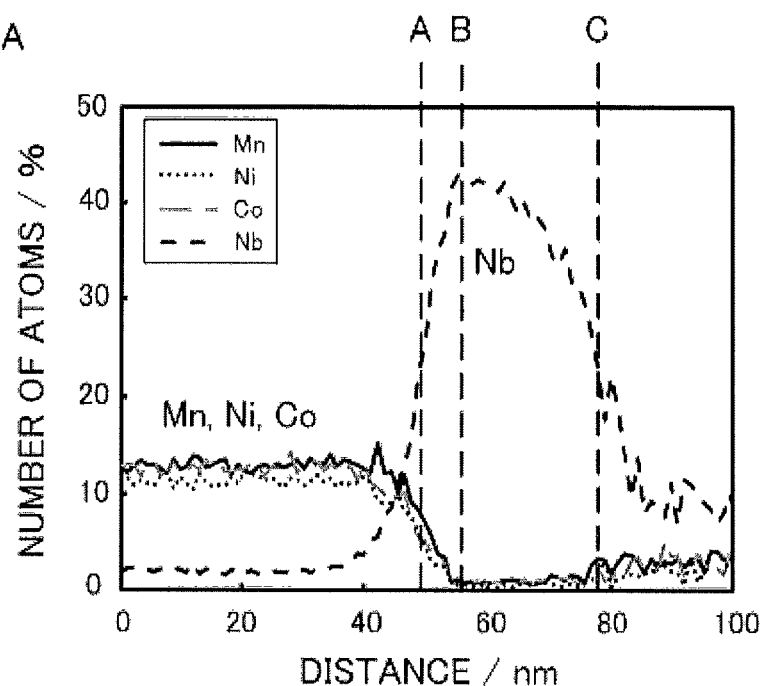
FIGS. 8A and 8B are graphs showing a result of component analysis of Comparative Example 2.
Figure 8B:
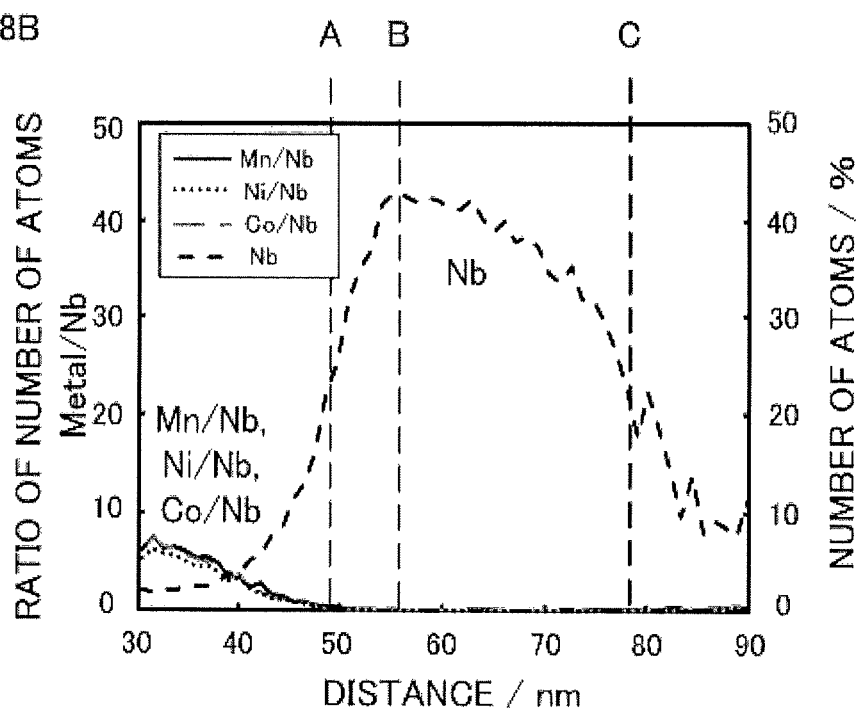

The component analysis result of Comparative Example 2 was shown in FIGS. 8A, 8B, and Table 4. As shown in FIG. 8A and Table 4, through the number of atoms of the Mn element, the Ni element and the Co element contained in the cathode active material and the number of atoms of the Nb element contained in the coating material, it was confirmed that the coating portion with an average thickness of 31 nm was formed on a surface of the cathode active material. The coating portion of Comparative Example 2 formed on a surface of the cathode active material $LiNi_{1/3}CO_{1/3}Mn_{1/3}O_2$ by a sol-gel method with the coating material $LiNbO_3$ scarcely contains the Mn element derived from the cathode active material. As shown in FIG. 8B and Table 4, the ratio of the Mn element to the Nb element, (Mn/Nb), the ratio of the Ni element to the Nb element, (Ni/Nb) and the ratio of the Co element to the Nb element, (Co/Nb) contained in the coating portion of Comparative Example 2 were 0.38, 0.27 and 0.24 respectively, any of whose was 1 or less, at an interface between the cathode active material and the coating portion, namely, in the location of A of FIG. 8B. The values of Mn/Nb, Ni/Nb and Co/Nb in B and C of Table 4 were extremely close to 0.

TABLE 4

|  | A | B | C | A – C |
|---|---|---|---|---|
| Distance (nm) | 48 | 55 | 79 | 31 |
| Number of atoms of Nb element (%) | 21.5 | 42.9 | 21.5 | 21.5 ≤ Nb ≤ 42.9 |
| Mn/Nb Ratio of number of atoms (—) | 0.38 | 0.026 | 0.015 | 0.014 ≤ Mn/Nb ≤ 0.38 |
| Ni/Nb Ratio of number of atoms (—) | 0.27 | 0.014 | 0.082 | 0.0054 ≤ Ni/Nb ≤ 0.27 |
| Co/Nb Ratio of number of atoms (—) | 0.24 | 0.016 | 0.10 | 0.0089 ≤ Co/Nb ≤ 0.24 |

REFERENCE SIGNS LIST

1 . . . cathode active material
2 . . . coating portion
10 . . . cathode active material for lithium battery
11 . . . cathode active material layer
12 . . . anode active material layer
13 . . . electrolyte layer
20 . . . lithium battery

What is claimed is:

1. A cathode active material complex for a lithium battery comprising:
    a cathode active material comprising an Mn element and being an oxide; and
    a coating portion formed on a surface of the cathode active material,
    wherein the coating portion comprises a Li element, a P element, an O element and the Mn element derived from the cathode active material, and
    a ratio of the Mn element to the P element, (Mn/P) is 1 or more at an interface between the cathode active material and the coating portion.

2. The cathode active material complex for a lithium battery according to claim 1, wherein when a location in which a number of atoms of the P element (%) becomes maximum in a thickness direction of the coating portion is regarded as B, the Mn/P in the location B is 0.79 or more.

3. A lithium battery comprising a cathode active material layer, an anode active material layer, and a solid electrolyte layer formed between the cathode active material layer and the anode active material layer,
    wherein the cathode active material layer comprises the cathode active material complex for a lithium battery according to claim 1, and
    at least one of the cathode active material layer and the solid electrolyte layer comprises a sulfide solid electrolyte material.

4. A lithium battery comprising a cathode active material layer, an anode active material layer, and a solid electrolyte layer formed between the cathode active material layer and the anode active material layer,
    wherein the cathode active material layer comprises the cathode active material complex for a lithium battery according to claim 2, and
    at least one of the cathode active material layer and the solid electrolyte layer comprises a sulfide solid electrolyte material.

5. A method for producing a cathode active material complex for a lithium battery, the cathode active material complex for a lithium battery comprising a cathode active material comprising an Mn element and being an oxide, and a coating portion,
    the method comprising a step of forming the coating portion on a surface of the cathode active material by using a sputtering method,
    wherein the coating portion comprises a Li element, a P element, an O element and the Mn element derived from the cathode active material, and
    a ratio of the Mn element to the P element, (Mn/P) is 1 or more at an interface between the cathode active material and the coating portion.

6. The method for producing a cathode active material complex for a lithium battery according to claim 5, wherein when a location in which a number of atoms of the P element (%) becomes maximum in a thickness direction of the coating portion is regarded as B, the Mn/P in the location B is 0.79 or more.

7. The method for producing a cathode active material complex for a lithium battery according to claim 1, wherein the ratio of the Mn element to the P element, (Mn/P) is 2 or more and 10 or less.

8. The method for producing a cathode active material complex for a lithium battery according to claim 1, wherein the ratio of the Mn element to the P element, (Mn/P) is 3 or more and 10 or less.

9. The method for producing a cathode active material complex for a lithium battery according to claim 1, wherein the cathode active material is a spinel type active material.

* * * * *